(12) United States Patent
Kushnir et al.

(10) Patent No.: US 10,103,761 B2
(45) Date of Patent: Oct. 16, 2018

(54) LOCAL OSCILLATOR SIGNAL GENERATION USING OPPORTUNISTIC SYNTHESIZER TO CLOCK DIGITAL SYNTHESIS

(71) Applicant: Intel Corporation, Santa Clara, CA (US)

(72) Inventors: Igal Kushnir, Hod-Hasharon (IL); Gil Horovitz, Emek-Hefer (IL); Sarit Zur, Petah-Tikva (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/275,779

(22) Filed: Sep. 26, 2016

(65) Prior Publication Data

US 2018/0091180 A1    Mar. 29, 2018

(51) Int. Cl.
*H04B 1/38* (2015.01)
*H04B 17/00* (2015.01)
(Continued)

(52) U.S. Cl.
CPC ............... *H04B 1/38* (2013.01); *H03L 7/08* (2013.01); *H04B 17/11* (2015.01); *H03B 21/00* (2013.01);
(Continued)

(58) Field of Classification Search
CPC ...... H03L 7/099; H03L 2207/06; H03B 21/00
See application file for complete search history.

(56) References Cited

U.S. PATENT DOCUMENTS 5,063,361 A * 11/1991 Smith .................... H03B 21/00
332/103
6,574,288 B1 * 6/2003 Welland ................. H03L 7/099
375/327
(Continued)

FOREIGN PATENT DOCUMENTS

WO          0225807 A2     3/2002
WO       2015074133 A1     5/2015

OTHER PUBLICATIONS

Murphy, Eva et al, "Alt About Direct Digital Synthesis." Ask the Application Engineer—33, Analog Dialogue 38-08, Aug. 2004. pp. 1-5.
(Continued)

*Primary Examiner* — Ross Varndell
(74) *Attorney, Agent, or Firm* — Eschweiler & Potashnik, LLC (57) ABSTRACT

Control circuitry for use in generating a local oscillator (LO) signal is provided. Synthesizer control circuitry is configured to control synthesizer circuitry to generate an analog oscillator signal having a first frequency at which phase noise is minimized. DS control circuitry is configured to generate a control word or message to cause DS circuitry to generate a digital DS signal having a desired frequency when the DS circuitry is clocked by the oscillator signal having the first frequency. The desired frequency is proportional to the LO signal frequency. The digital DS signal generated by the DS circuitry is used to generate the LO signal. Thus the first frequency used to clock the DS circuitry is selected to optimize the oscillator rather than having some relationship to the LO frequency. In addition, a single synthesizer may be used in order to simultaneously generate many LO signals.

19 Claims, 5 Drawing Sheets

(51) Int. Cl.
  *H04B 17/11*  (2015.01)
  *H03L 7/08*  (2006.01)
  *H03B 21/00*  (2006.01)
  *H03B 21/01*  (2006.01)
  *H03L 7/099*  (2006.01)
  *H04L 27/20*  (2006.01)

(52) U.S. Cl.
  CPC .............. *H03B 21/01* (2013.01); *H03L 7/099* (2013.01); *H03L 2207/06* (2013.01); *H04L 27/205* (2013.01)

(56) References Cited

U.S. PATENT DOCUMENTS

| | | | |
|---|---|---|---|
| 7,272,373 B2* | 9/2007 | Tuttle | H04B 1/30 455/209 |
| 7,750,685 B1* | 7/2010 | Bunch | H03L 7/087 327/23 |
| 7,932,784 B1* | 4/2011 | Janesch | H03L 7/087 331/10 |
| 2006/0030277 A1 | 2/2006 | Cyr | |
| 2008/0055008 A1* | 3/2008 | Staszewski | H03B 21/00 331/37 |
| 2009/0085673 A1* | 4/2009 | Rofougaran | H03L 7/1806 331/18 |
| 2009/0085675 A1* | 4/2009 | Rofougaran | H03L 7/18 331/18 |
| 2009/0086844 A1* | 4/2009 | Rofougaran | H03B 21/01 375/295 |
| 2010/0109714 A1 | 5/2010 | Lindfors | |
| 2013/0034137 A1* | 2/2013 | Zuckerman | H04L 25/0266 375/222 |
| 2014/0002287 A1 | 1/2014 | Klepser et al. | |

OTHER PUBLICATIONS

Kuleshov, Liu, Fundamental Noise in Direct Digital Frequency Synthesizers, 1995 IEEE International Frequency Control Symposium, p. 288-293.

International Search Report and Written Opinion dated Nov. 20, 2017 in connection with International Patent Application No. PCT/US2017/047100.

* cited by examiner

LOCAL OSCILLATOR SIGNAL GENERATION USING OPPORTUNISTIC SYNTHESIZER TO CLOCK DIGITAL SYNTHESIS

FIELD

The present disclosure relates to the field of radio frequency (RF) transceivers and in particular to methods and apparatus for generating LO signals with reduced phase noise.

BACKGROUND

The performance of communication systems like Wireless Fidelity (WiFi), Long Term Evolution (LTE), backhaul, 5G, and so on, is significantly affected by the phase noise of the LO signal generators that are used to produce the transmit (TX) and receive (RX) LO signals. For example, the phase noise of the LO signal generator degrades the error vector magnitude (EVM) of a transceiver. Furthermore, modern mobile communication devices (e.g., smartphones, laptops, and so on) support co-running of different communication systems, with each communication system operating at a different frequency and thus utilizing a different LO signal. Thus LO signal generation systems are being used to generate increasingly diverse LO signals, which increases the risk of degradation of device performance.

DETAILED DESCRIPTION

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," "circuitry" and the like are intended to refer to a computer-related entity, hardware, software (e.g., in execution), and/or firmware. For example, a circuitry can be a circuit, a processor, a process running on a processor, a controller, an object, an executable, a program, a storage device, and/or a computer with a processing device.

Figure 1A:
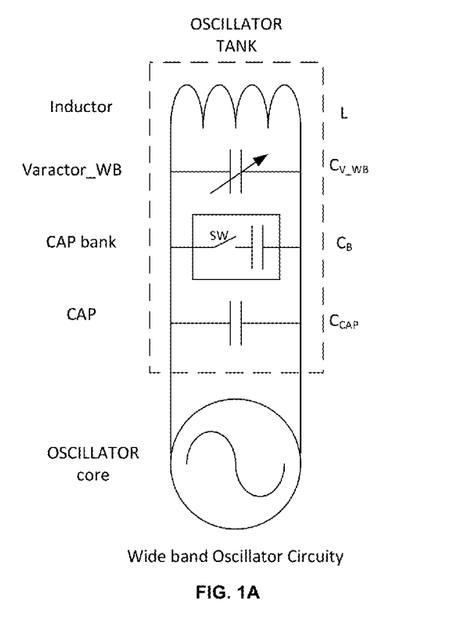
FIG. 1A illustrates an exemplary wide band oscillator circuit.

Many LO signal generation systems utilize a dedicated phase locked loop (PLL) to generate an LO signal for each LO frequency range that may be used by a communication device. This increases the size, cost, and power consumption of the device. These LO generation systems rely on PLLs with a wide band voltage controlled oscillator (VCO) or a digital controlled oscillator (DCO) (hereinafter "oscillator" refers to either VCO or DCO). FIG. 1A illustrates a typical wide band oscillator. The oscillator includes a core that oscillates in response to an oscillating voltage generated by an LC or tank circuit. A control signal (not shown) selectively activates capacitors in a capacitor bank to select a frequency band for the oscillator signal. The control signal also adjusts a varactor for fine adjustments within the frequency band. The wide band oscillator has a tuning range that is defined by the range of the adjustable components (e.g., the capacitor bank and the varactor) in the tank circuit.

To cope with the broad range of frequencies experienced by the device, the tuning range for the oscillator is often made as wide as possible. However, as the tuning range increases, the quality factor (Q) of the tank circuit is decreased, resulting in increased phase noise in the oscillator signal. The Q of the tank circuit is expressed as:

$$\frac{1}{Q_{total}} = \frac{1}{Q_{inductor}} + \frac{1}{Q_{varactor}} + \frac{1}{Q_{CAP\_BANK}} + \frac{1}{Q_{CAP}} \qquad \text{EQ. 1}$$

Figure 1B:
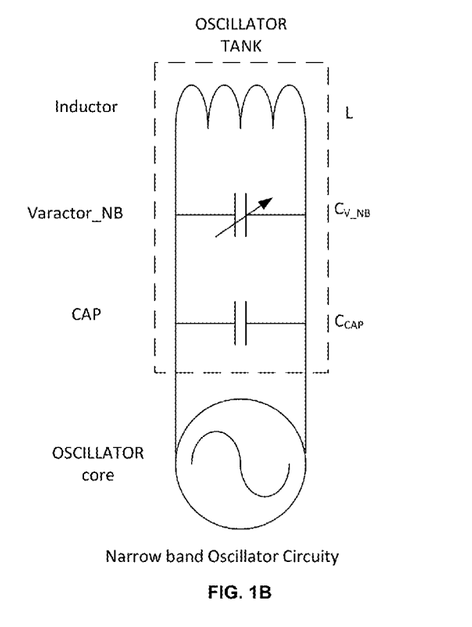
FIG. 1B illustrates an exemplary narrow band oscillator circuit.
Figure 1C:
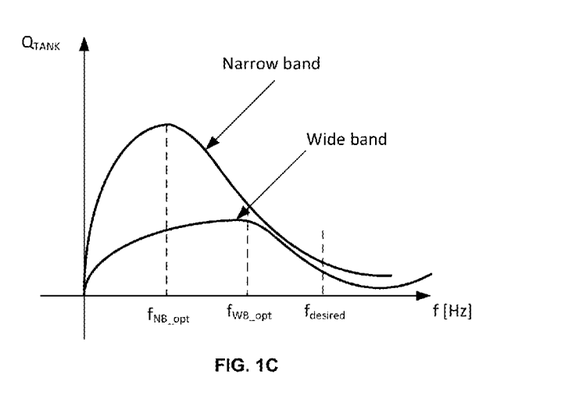
FIG. 1C illustrates comparison of Q factor of a wide band oscillator circuit and a narrow band oscillator circuit.

Most of the degradation to Q is due to the capacitor bank and the large varactor needed to provide the wide tuning range of the oscillator. FIG. 1C illustrates the Q factor of a tank circuit as a function of oscillator signal frequency for both a wide band oscillator and a narrow band oscillator. It can be seen that the Q factor of the wide band oscillator is relatively low over the whole range of frequencies. Leeson's oscillator phase noise model teaches that increasing the Q of the oscillator tank improves the phase noise. In fact, it can be shown that increasing the Q by k improves the phase noise by 20 log(k).

Another difficulty with LO generation systems that utilize wide band oscillators is that the frequency at which the oscillator ultimately operates is selected based on the desired LO signal frequency rather than on the Q of the tank circuit. This means that the oscillator is almost certainly generating increased phase noise because the tank circuit not operating at maximum Q. It can be seen in FIG. 1C that given a typical desired frequency of 21-24 GHz (four times the TX and RX LO frequency for many WiFi applications), the wide band oscillator is operating in a very low Q range as opposed to the frequency ($f_{WB\_opt}$) at which the wide band oscillator has maximum Q. In a typical WiFi application, the oscillator has a tuning range of about 20% of oscillator's natural frequency and operates at a Q factor of about 10.

A further problem in LO generation systems is oscillator pulling, which is a deviation in the frequency of the signal generated by the oscillator due to a harmonic relationship between the TX and RX signals generated by a power amplifier in the transceiver and the oscillator signal. In many applications, the oscillator signal frequency is selected to be a multiple of the TX or RX signal frequency. This means that the oscillator signal is a harmonic of the TX or RX signal, making the oscillator susceptible to pulling.

The LO signal generation circuitry described herein uses a narrow band oscillator operating at an "optimal" frequency for the oscillator, rather than a frequency selected based on the desired LO signal, to generate a digital signal that is used to generate the LO signal. FIG. 1B illustrates one embodiment of a narrow band oscillator suitable for use in the LO signal generation circuitry that will be described herein. The narrow band oscillator is designed to operate within a narrow frequency range and as such does not include a capacitor bank in the tank circuit. Further, the size of the varactor_NB is smaller than the varactor_WB of the wide band oscillator. The varactor_NB is sized to allow for minimal adjustment of the oscillator's output frequency to adapt to changes in temperature, greatly reducing the size of the varactor needed. In one embodiment, the frequency range of the narrow band oscillator is about 0.5% of the oscillator's natural frequency. In one embodiment, the optimal frequency $f_{NB\_opt}$ for the tank circuit is the "free running" frequency of the oscillator, which corresponds to the frequency of the oscillator when the PLL is operating in open loop configuration.

The elimination of the capacitor bank and the reduction in the size of the varactor greatly improves the Q factor of the tank circuit and also reduces power consumption by the oscillator. In one embodiment the narrow band oscillator, when operating at the optimal frequency $f_{NB\_opt}$, has a Q factor of 20. This means that the phase noise generated by the narrow band oscillator at the optimal frequency is significantly lower than the phase noise generated by the wide band oscillator at any frequency. While for the purposes of this description, the "optimal" frequency for the narrow band oscillator is described as being the frequency at which the Q for the oscillator is maximized (e.g., the free running frequency), the optimal frequency may be selected to maximize any operational characteristic of the oscillator (e.g., power consumption, and so on).

Figures 2, 3A:
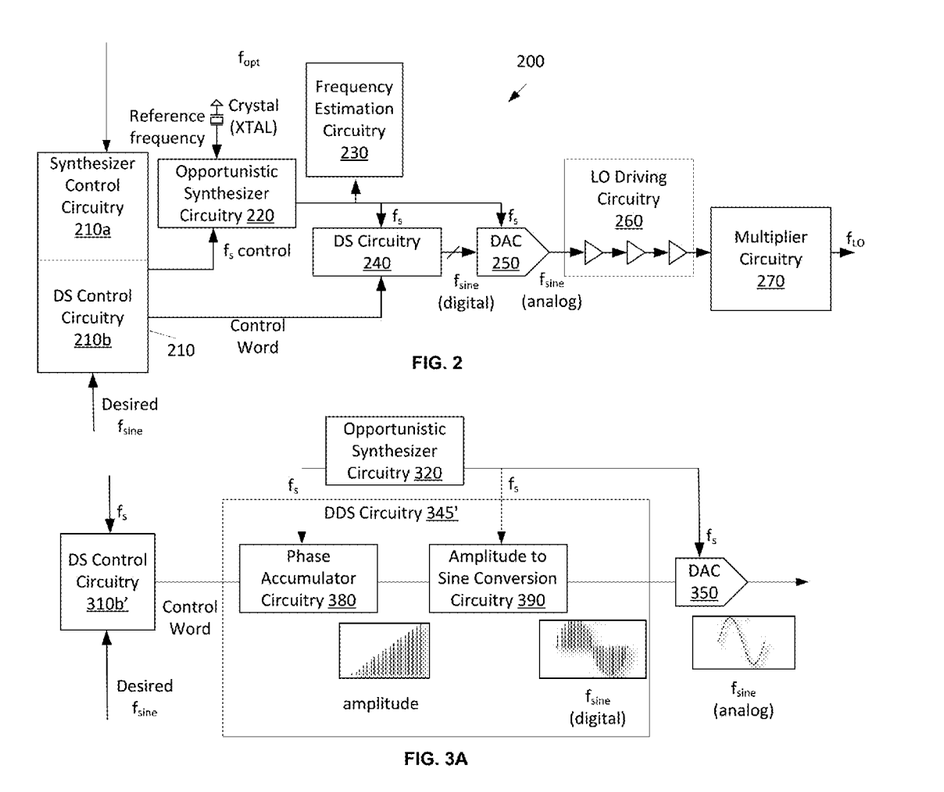
FIG. 2 illustrates one exemplary LO signal generation system in accordance with various aspects described.
FIG. 3A illustrates one exemplary digital synthesis (DS) circuitry of the LO signal generation system of FIG. 2, in accordance with various aspects described.

FIG. 2 illustrates one embodiment of LO signal generation circuitry 200 configured to generate an LO signal in a manner that allows for use of a narrow band oscillator operating at an "optimal" frequency. The output of the LO signal generation circuitry 200 is an LO signal having a desired frequency $f_{LO}$ that is determined based on the communication protocol in use (e.g., WiFi, LTE, and so on). The LO signal generation circuitry 200 includes opportunistic synthesizer circuitry 220 and digital synthesis (DS) circuitry 240 that are controlled by control circuitry 210. The synthesizer circuitry 220 includes a narrow band oscillator, for example the oscillator of FIG. 1B. Synthesizer control circuitry 210a is configured to determine the "optimal" frequency "$f_{opt}$" for the narrow band oscillator and to generate a control signal "$f_s$ control" that will control the opportunistic synthesizer to generate an oscillator signal having a constant frequency $f_s$ that is equal to the determined optimal frequency $f_{opt}$.

In one embodiment, the opportunistic synthesizer circuitry 220 includes a PLL and the synthesizer control circuitry 210a is configured to cause the PLL to first operate in an open loop configuration so that the free running frequency of the narrow band oscillator $f_{opt}$ may be measured by frequency estimation circuitry 230. In one embodiment, the frequency estimation circuitry 230 measures the oscillator signal frequency using the reference or crystal frequency of the crystal XTAL. The synthesizer control circuitry 210a then causes the PLL to operate in a closed loop configuration. The synthesizer control circuitry 210a generates the $f_s$ oscillator control signal that will lock the PLL's output oscillator signal to have a frequency of fs, which is the free running frequency of the oscillator. Recall that this allows the oscillator to operate at maximum Q, thereby producing the least amount of phase noise in the oscillator signal. In other embodiments, the synthesizer control circuitry 210a determines an optimal frequency for the oscillator in some other manner, such as accessing a look up table that maps LO signal circuitry operating conditions (e.g., temperature) to an optimal frequency, and so on. The optimal frequency may be selected that optimizes any operational aspect of the narrow band oscillator. Note that the determination of $f_{opt}$ is completely independent of the desired LO signal frequency $f_{LO}$.

The oscillator signal, having frequency $f_s$, is provided as a very low phase noise clock signal to the DS circuitry 240 and a digital to analog converter (DAC) 250. FIG. 3A illustrates one embodiment in which the DS circuitry comprises a direct digital synthesizer (DDS) circuitry 345'. The DDS circuitry 345' is configured to generate a time-varying waveform in digital form $f_{sine}$ (digital). The digital time varying waveform is converted to an analog signal $f_{sine}$ (analog) by a DAC 350. The frequency of the signal $f_{sine}$ is selected to be proportional to the frequency $f_{LO}$ of the LO signal. Hereinafter the signal fsine (digital) will be referred as the digital DS signal having a "desired frequency" which is proportional to the desired LO signal frequency $f_{LO}$.

Because the DDS circuitry 345' is a digital device, the DDS circuitry 345' can quickly switch between operating frequencies, provides fine frequency resolution and operates over a broad spectrum of frequencies. The DDS circuitry 345' includes phase accumulator circuitry 380 and a phase amplitude to sine conversion circuitry 390. The DDS circuitry 345' generates a sine wave at a given frequency. The frequency of the digital DDS signal depends on two variables, the clock signal frequency $f_s$ provided by the opportunistic synthesizer circuitry 320 and the control word or control message provided to the phase accumulator circuitry 380 by DS control circuitry 310b'. In one embodiment, the DS control circuitry 310b' is configured to program the control word or message into a frequency register of the DDS circuitry 345' (not shown).

Continuous-time sinusoidal signals have a repetitive angular phase range of 0 to $2\pi$. The digital implementation is no different. A counter's carry function allows the phase accumulator to act as a phase wheel in the DS circuitry 380. Conceptualizing the sine-wave oscillation as a vector rotating around a phase circle. Each designated point on the phase wheel corresponds to the equivalent point on a cycle of a sine wave. As the vector rotates around the wheel, the sine of the angle generates a corresponding output sine wave. One revolution of the vector around the phase wheel, at a constant speed, results in one complete cycle of the output sine wave. The phase accumulator circuitry 380 provides the equally spaced angular values accompanying the vector's linear rotation around the phase wheel. The contents of the phase accumulator circuitry 380 correspond to the points on the cycle of the output sine wave.

In one embodiment, the phase accumulator circuitry 380 is a modulo-M counter that increments its stored number each time it receives a clock pulse. The magnitude of the increment is determined by the control word or message, which binary-coded. The control word or message forms the phase step size between reference clock updates; the control word or message effectively sets how many points to skep around the phase wheel. The larger the jump size, the faster the phase accumulator circuitry 380 overflows and completes its equivalent of a sine wave cycle. The number of discrete phase points contained in the wheel is determined by the resolution of the phase accumulator circuitry 380 ($n$) which determines the tuning resolution of the DDS circuitry 345'. For an n=28 bit phase accumulator, an M value of 0000 . . . 0001 would result in the phase accumulator circuitry 380 overflowing after 2228 clock cycles (increments). If the M value is changed to 0111 . . . 1111, the phase accumulator will overflow after only 2 clock cycles. The is relationship is found in the basic tuning equation for the DS circuitry:

$$f_{out} = \frac{M \times f_s}{2^n} \quad \text{EQ. 2}$$

where $f_{out}$ is the desired frequency of the digital DS signal output by the DDS circuitry 345', M is the control word or message, $f_s$ is the clock frequency, and n is the length of the counter in the phase accumulator circuitry 380. Thus, give a desired frequency $f_{out}$, selected to be proportional to the desired LO signal frequency $f_{LO}$, the value of M may be readily calculated.

Changes to the control word or message result in immediate and phase continuous changes in the output frequency. No loop settling time is incurred as in the case of a PLL. When generating a constant frequency signal, the output of the phase accumulator circuitry 380 increases linearly, so the waveform generated is a ramp.

The amplitude to sine conversion circuitry 390 uses a phase-to-amplitude lookup table to convert the instantaneous amplitude output by the phase accumulator circuitry 380 to a sine wave amplitude signal $f_{sine}$ (digital) which is the desired digital DS signal. The amplitude output by the phase accumulator circuitry 380 is an address for the lookup table. The amplitude to sine conversion circuitry 390 exploits the symmetrical nature of a sine wave and utilizes mapping logic to synthesize a complete sine wave from one quarter cycle of data from the phase accumulator circuitry 380. The amplitude to sine conversion circuitry 390 then generates the remaining data by reading forward then back through the lookup table. A DAC 350 converts each digital amplitude value in the digital DS signal $f_{sine}$ to a corresponding voltage or current.

Figure 3B:
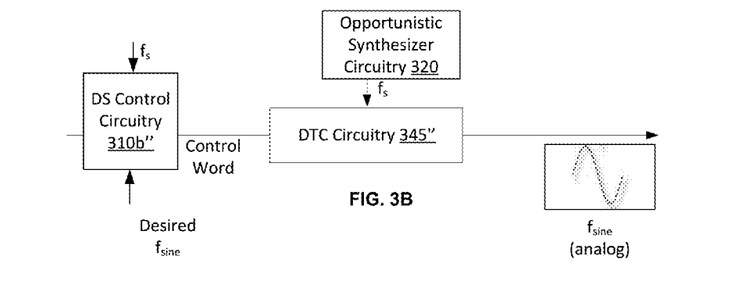
FIG. 3B illustrates one exemplary digital synthesis (DS) circuitry of the LO signal generation system of FIG. 2, in accordance with various aspects described.

FIG. 3B illustrates one embodiment in which the DS circuitry comprises a digital to time convertor (DTC) circuitry 345". The DTC circuitry 345" is configured to generate a time-varying waveform in digital form $f_{sine}$ (digital). The digital time varying waveform may be used directly as the LO signal. The frequency of the signal $f_{sine}$ is selected to be proportional to the frequency $f_{LO}$ of the LO signal.

The DTC circuitry 345" is a digital-to-analog data converter that generates an output signal having a period or edge delay based on a control word or message and a reference clock signal. For example, the DTC circuitry 345" may include a clock divider circuit as a digital-to-time period converter that generates an output clock signal based on a reference clock signal and a digital control word or message indicating a divide ratio (e.g. an integer divide ratio or a fractional divide ratio). The analog output is the period of the output clock signal. The output clock period is based on the digital control word or message and the clock period of the reference clock signal. The output clock signal has a digitally-defined, full-scale range and a least-significant bit clock period.

Because the DTC circuitry 345" is a digital device, the DTC circuitry 345" can quickly switch between operating frequencies, provides fine frequency resolution and operates over a broad spectrum of frequencies. The frequency of the DTC output signal depends on two variables, the clock signal frequency $f_s$ provided by the opportunistic synthesizer circuitry 320 and the control word or message provided by DS control circuitry 310b". Thus, in the embodiment of FIG. 3B the DS control circuitry 310b" is configured to generate a control word or message that will cause the DTC circuitry 345" to generate a DTC signal having the desired frequency (e.g., the frequency of signal $f_{sine}$) when the DTC circuitry 345" is clocked by the oscillator signal which has the optimal frequency. The DS control circuitry 310b" provides the control word or message to the DS circuitry.

Figure 4:
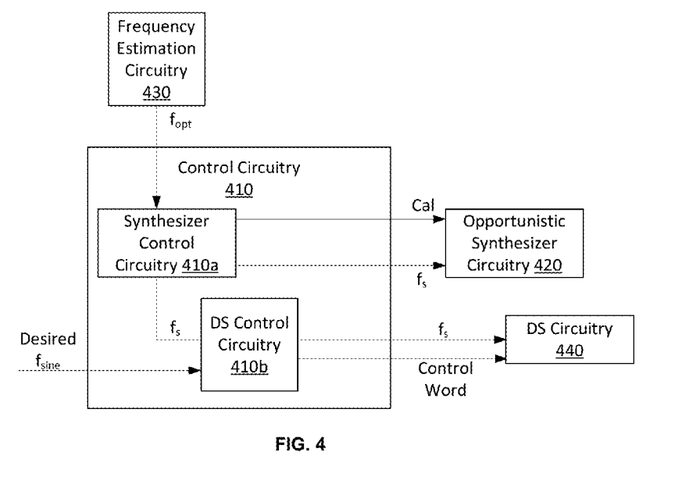
FIG. 4 illustrates one exemplary control circuitry of the LO signal generation system of FIG. 2, in accordance with various aspects described.

FIG. 4 illustrates one embodiment of control circuitry 410 configured to control opportunistic synthesizer circuitry 420 and DS circuitry 440 to generate a digital DS signal having a frequency that is proportional to a desired LO signal frequency. The control circuitry 410 includes synthesizer control circuitry 410a is configured to determine an optimal frequency $f_s$ that optimizes at least one aspect of the opportunistic synthesizer circuitry 420 and control the opportunistic synthesizer circuitry to generate an oscillator signal having the optimal frequency.

In some embodiments, the optimal frequency $f_s$ is the free running frequency $f_{opt}$ of the oscillator measured by frequency estimation circuitry 430 and input to synthesizer control circuitry 410a. The synthesizer control circuitry 410a sends a calibration trigger signal to the opportunistic synthesizer circuitry 420 to cause the opportunistic synthesizer circuitry 420 to operate in open loop mode so that the free running frequency $f_{opt}$ can be measured by frequency estimation circuitry 430. The synthesizer control circuitry 410a then controls the opportunistic synthesizer circuitry 420 to operate in closed loop mode at the optimal frequency $f_s$.

The DS control circuitry 410b is configured to generate a control word or message that will cause the DS circuitry 440 to generate a DS signal having the desired frequency (e.g., the frequency of signal $f_{sine}$) when the DS circuitry is clocked by the oscillator signal which has the optimal frequency and provide the control word or message and the oscillator signal to the DS circuitry. In one embodiment, the DS control circuitry 410b solves Equation 4 based on the desired DS signal frequency to determine the control word or message. Thus, the control word or message for the DS circuitry 440 is determined based on the optimal frequency which is determined independent of the desired LO signal. When a different LO signal is used, the oscillator signal remains at the same optimal frequency. The control word or message for the DS circuitry 440 is changed so that a digital DS signal that is proportional to the desired LO signal frequency is generated based on the same optimal oscillator signal frequency $f_s$.

During normal operation, the synthesizer control circuitry 410a makes only minor adjustments to the opportunistic synthesizer circuitry 420 to account for minor temperature changes. However, it may be desirable to periodically determine a new optimal frequency to compensate for oscillator frequency variation due to frequency drift. Thus, in one embodiment, the synthesizer control circuitry is configured to determine that a calibration condition has been met. The calibration condition may be a temperature variation measured proximate the oscillator that exceeds a threshold or a predetermined amount of time that has elapsed since the last calibration. The synthesizer control circuitry 410a determines a new optimal frequency and controls the opportunistic synthesizer circuitry 420 to generate a new oscillator signal having the new optimal frequency. When a new optimal frequency $f_s$ has been determined, the DS control circuitry is configured to generate a new control word or message for DS circuitry 440 that will cause the DS circuitry to generate the digital DS signal having the same desired frequency when the DS circuitry is clocked by the new oscillator signal having the new optimal frequency. The DS control circuitry 410b provides the new control word or message and the second oscillator signal to the DS circuitry.

Returning to FIG. 2, in one embodiment, the analog version of the DS signal $f_{sine}$ (analog) is provided to LO driving circuitry 260. When the frequency of the DS signal is N times lower than the final LO signal (recall that the frequency of the DS signal was selected to be proportional to the frequency of the desired LO signal), the LO driving circuitry consumes low power because driving circuitry operates at a frequency that is N times lower than the final LO frequency. The output of the LO driving circuitry 260 may be provided to multiplier circuitry 270 that multiples the signal's frequency to the LO signal frequency. In one embodiment, the multiplier circuitry includes a low power injection locked multiplier (ILM). Quadrature I/Q can be generated using a quadrature ILM or a polyphase or divide by 2 (in which case the ILM should generate twice the LO signal frequency).

It can be seen in FIG. 2, that the LO signal generation circuitry 200 utilizes an ultra-narrow band width oscillator running at an optimal frequency for the tank circuit (e.g., the free running frequency). The narrow band oscillator is followed by a DAC 250 that compensates for the free running oscillator process variation and provides the desired frequency range for the communication system. The signal at the output of the DAC can be used as the LO signal or can be fed to multiplier circuitry 270 for harmonic multiplication of the DAC signal. The multiplier circuitry 270 can also be used as a filter for DAC harmonic and replicas. The oscillator of the opportunistic synthesizer circuitry 220 is designed to run at an optimal frequency, producing the lowest possible phase noise. This is achieved by designing the oscillator with the maximal possible Q factor of the tank circuit. The oscillator is designed with minimal tuning range having only to compensate for temperature variation and hence provides the best Q to the tank circuitry.

Figure 5:
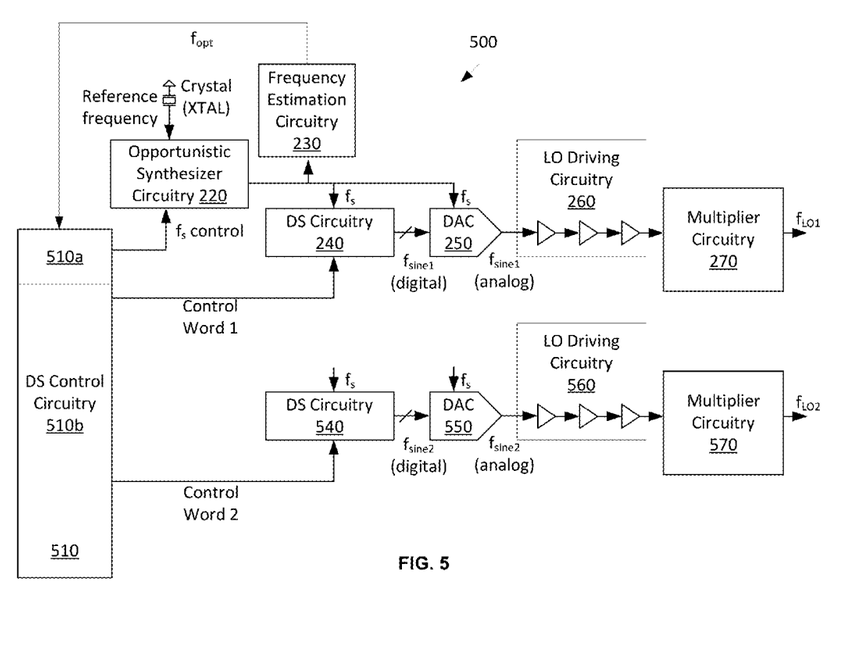
FIG. 5 illustrates another exemplary LO signal generation system in accordance with various aspects described.

FIG. 5 illustrates one embodiment of LO signal generation circuitry 500 that is configured to generate two different LO signals having frequencies $f_{LO1}$ and $f_{LO2}$. A single opportunistic synthesizer circuitry 220 is used to generate both LO signals. Synthesizer control circuitry 510a is configured to determine the optimal frequency fs for the opportunistic synthesizer 220 and control the opportunistic synthesizer to operate at the optimal frequency. DS control circuitry 510b generates a first control word or message for first DS circuitry 240 that will cause the first DS circuitry to generate a first digital DS signal $f_{sine1}$ having a first desired frequency when the DS circuitry is clocked by the oscillator signal having the optimal frequency. The first desired frequency is selected to be proportional to the first desired local oscillator (LO) signal. The DS control circuitry 510b provides the first control word or message and the oscillator signal to the first DS circuitry. A first DAC 250 is configured to convert the first DS signal to an analog signal for use in generating the first LO signal.

DS control circuitry 510b generates a second control word or message for first DS circuitry 240 that will cause second DS circuitry 540 to generate a second digital DS signal $f_{sine2}$ having a second desired frequency when the DS circuitry is clocked by the oscillator signal having the optimal frequency. The second desired frequency is selected to be proportional to the second desired local oscillator (LO) signal. The DS control circuitry 510b provides the second control word or message and the oscillator signal to the second DS circuitry 540. A second DAC 550 is configured to convert the second DS signal to an analog signal for use in generating the second LO signal. Power and space are conserved by using the same opportunistic synthesizer circuitry 220 to generate both LO signals, especially because the opportunistic synthesizer circuitry occupies a large portion of the LO signal generation circuitry 500. Of course, additional chains of DS signal circuitry, DAC, LO driving circuitry and multiplier circuitry clocked by the same oscillator signal may be added to generate additional LO signals.

Figure 6:
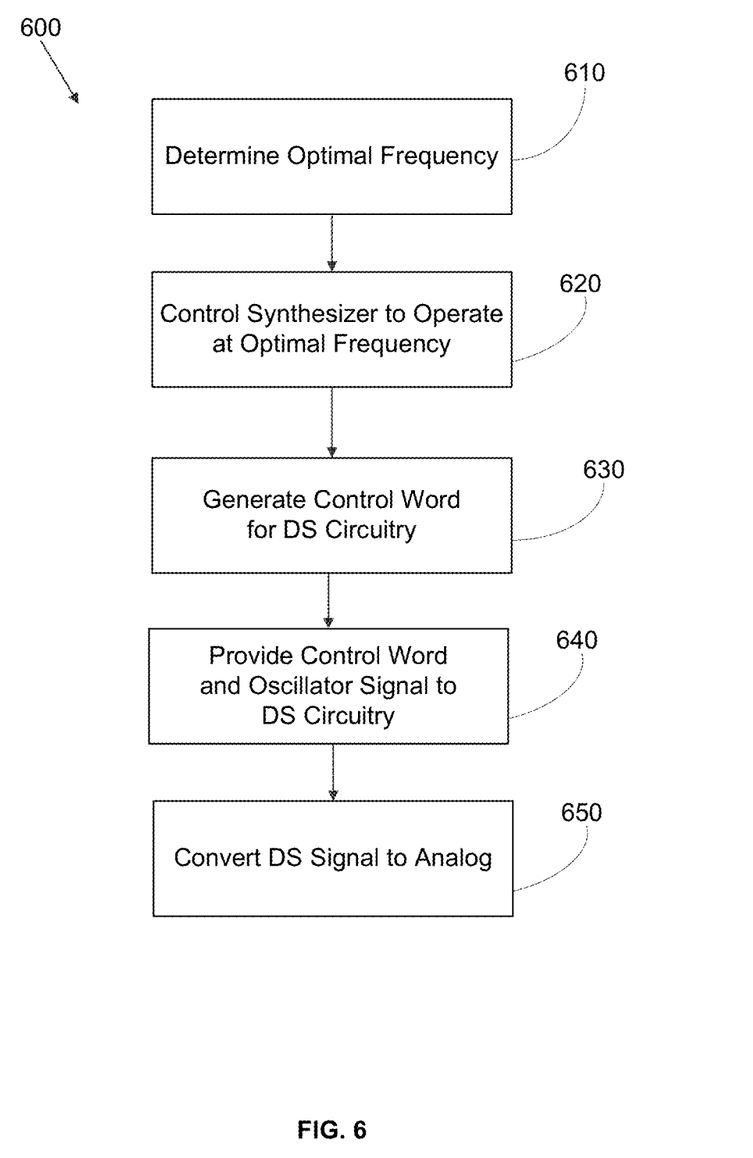
FIG. 6 illustrates an exemplary method configured to generate an LO signal in accordance with various aspects described.

FIG. 6 illustrates a flow diagram 600 that outlines a method configured to generate an LO signal. The method includes, at 610, determining, for synthesizer circuitry, a first frequency that optimizes at least one operational aspect of the synthesizer circuitry. The determining may be performed by the synthesizer control circuitry 210a of FIG. 2, 410a of FIG. 4, and/or 510a of FIG. 5. At 620, the synthesizer circuitry is controlled to generate an oscillator signal having the first frequency. The controlling may be performed by the synthesizer control circuitry 210a of FIG. 2, 410a of FIG. 4, and/or 510a of FIG. 5. At 630, the method includes generating a control word or message for digital synthesis (DS) circuitry that will cause the DS circuitry to generate a digital DS signal having a desired frequency when the DS circuitry is clocked by the oscillator signal having the first frequency. The desired frequency is selected to be proportional to a frequency of a desired local oscillator (LO) signal. The generating may be performed by the DS control circuitry 210b of FIG. 2, 310b of FIG. 3, 410b of FIG. 4, and/or 510b of FIG. 5. At 640, the control word or message and the oscillator signal are provided to the DS circuitry. The providing may be performed by the DS control circuitry 210b of FIG. 2, 310b of FIG. 3, 410b of FIG. 4, and/or 510b of FIG. 5. At 650, the method includes converting the DS signal to an analog signal for use in generating the desired LO signal. The converting may be performed by the DAC 250 of FIG. 2, 350 of FIG. 3, and/or 250 and 550 of FIG. 5.

It can be seen from the foregoing description that local oscillator signal generation using opportunistic synthesizer to clock digital synthesis as described herein results in ultra-low phase noise and low power consumption, providing better system level performance. Simultaneous and efficient multi-frequency communication is supported with minimal impact on size. Pulling on the oscillator by the power amplifier is eliminated because there is no harmonic relationship between the optimal frequency and the LO signal frequency.

Figure 7:
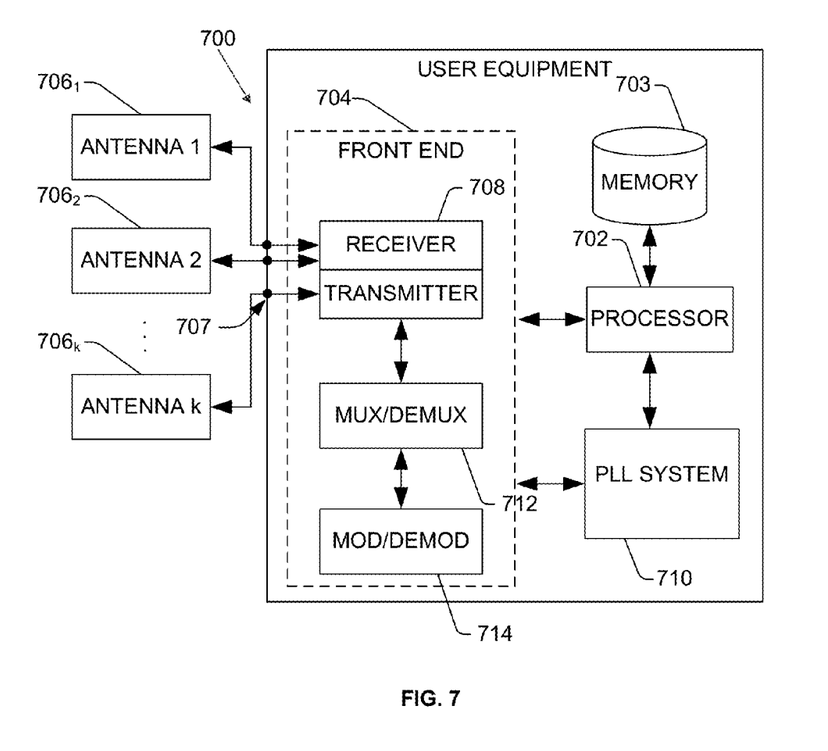
FIG. 7 illustrates an example user equipment device that includes an LO signal generation system in accordance with various aspects described.

To provide further context for various aspects of the disclosed subject matter, FIG. 7 illustrates a block diagram of an embodiment of user equipment 700 (e.g., a mobile device, communication device, personal digital assistant, etc.) related to access of a network (e.g., base station, wireless access point, femtocell access point, and so forth) that can enable and/or exploit features or aspects of the disclosed aspects.

The user equipment or mobile communication device 700 can be utilized with one or more aspects of the PLLs and devices described herein according to various aspects. The user equipment device 700, for example, comprises a digital baseband processor 702 that can be coupled to a data store or memory 703, a front end 704 (e.g., an RF front end, an acoustic front end, or the other like front end) and a plurality of antenna ports 707 for connecting to a plurality of antennas $706_1$ to $706_k$ (k being a positive integer). The antennas $706_1$ to $706_k$ can receive and transmit signals to and from one or more wireless devices such as access points, access terminals, wireless ports, routers and so forth, which can operate within a radio access network or other communication network generated via a network device (not shown).

The user equipment 700 can be a radio frequency (RF) device for communicating RF signals, an acoustic device for communicating acoustic signals, or any other signal communication device, such as a computer, a personal digital assistant, a mobile phone or smart phone, a tablet PC, a modem, a notebook, a router, a switch, a repeater, a PC, network device, base station or a like device that can operate to communicate with a network or other device according to one or more different communication protocols or standards.

The front end 704 can include a communication platform, which comprises electronic components and associated circuitry that provide for processing, manipulation or shaping of the received or transmitted signals via one or more receivers or transmitters (e.g. transceivers) 708, a mux/demux component 712, and a mod/demod component 714. The front end 704 is coupled to the digital baseband processor 702 and the set of antenna ports 707, in which the set of antennas 7061 to 706$k$ can be part of the front end. In one aspect, the user equipment device 700 can comprise a phase locked loop system 710 that includes LO signal generation systems 200 of FIG. 2 and/or 500 of FIG. 5.

The processor 702 can confer functionality, at least in part, to substantially any electronic component within the mobile communication device 700, in accordance with aspects of the disclosure. As an example, the processor 700 can be configured to execute, at least in part, executable instructions that estimate the AMPM delay value for the transceiver 708 and/or generate a calibration signal. Thus the processor 700 may embody various aspects of the control circuitry 210 of FIGS. 2 and 3, 410 of FIG. 4, and/or 510 of FIG. 5.

The processor 702 is functionally and/or communicatively coupled (e.g., through a memory bus) to memory 703 in order to store or retrieve information necessary to operate and confer functionality, at least in part, to communication platform or front end 704, the phase locked loop system 710 and substantially any other operational aspects of the phase locked loop system 710. The phase locked loop system 710 includes at least one oscillator (e.g., a VCO, DCO or the like, see FIG. 1B) that can be calibrated via core voltage, a coarse tuning value, signal, word or selection process.

The processor 702 can operate to enable the mobile communication device 700 to process data (e.g., symbols, bits, or chips) for multiplexing/demultiplexing with the mux/demux component 712, or modulation/demodulation via the mod/demod component 714, such as implementing direct and inverse fast Fourier transforms, selection of modulation rates, selection of data packet formats, interpacket times, etc. Memory 703 can store data structures (e.g., metadata), code structure(s) (e.g., modules, objects, classes, procedures, or the like) or instructions, network or device information such as policies and specifications, attachment protocols, code sequences for scrambling, spreading and pilot (e.g., reference signal(s)) transmission, frequency offsets, cell IDs, and other data for detecting and identifying various characteristics related to RF input signals, a power output or other signal components during power generation. Memory 703 may include a static random access memory (SRAM) that stores control words (e.g., lookup table) for use by control circuitry 210 of FIGS. 2 and 3, 410 of FIG. 4, and/or 510 of FIG. 5.

Examples herein can include subject matter such as a method, means for performing acts or blocks of the method, at least one machine-readable medium including executable instructions that, when performed by a machine (e.g., a processor with memory or the like) cause the machine to perform acts of the method or of an apparatus or system for concurrent communication using multiple communication technologies according to embodiments and examples described.

Example 1 is a method configured to generate an LO signal. The method includes determining, for synthesizer circuitry, a first frequency to optimize at least one operational aspect of the synthesizer circuitry; controlling the synthesizer circuitry to generate an oscillator signal having the first frequency; generating a control message to cause a digital synthesis (DS) circuitry to generate a digital DS signal having a desired frequency based on the oscillator signal having the first frequency, wherein the desired frequency is proportional to a frequency of a desired local oscillator (LO) signal; providing the control message and the oscillator signal to the DS circuitry; and converting the DS signal to an analog signal to generate the desired LO signal.

Example 2 includes the subject matter of example 1, including or omitting optional elements, wherein the synthesizer circuitry includes a tank circuit, further wherein determining the first frequency comprises identifying a frequency that maximizes a Q value for the tank circuit.

Example 3 includes the subject matter of example 1, including or omitting optional elements, wherein the synthesizer circuitry includes an oscillator and a tank circuit, further wherein determining the first frequency includes: causing the synthesizer circuitry to operate in an open loop mode such that the oscillator oscillates at a free running frequency; measuring a frequency of the signal output by the oscillator; and determining the first frequency to be the measured frequency.

Example 4 includes the subject matter of examples 1-3, including or omitting optional elements, including: determining that a calibration condition has been met, determining, for the synthesizer circuitry, a second frequency to optimize the at least one operational aspect of the synthesizer circuitry; controlling the synthesizer circuitry to generate a second oscillator signal having the second frequency; generating a new control message that will cause the DS circuitry to generate the digital DS signal having the desired frequency based on the second oscillator signal having the second frequency; providing the new control message and the second oscillator signal to the DS circuitry; and converting the DS signal to an analog signal to generate the desired LO signal.

Example 5 includes the subject matter of example 4, including or omitting optional elements, wherein determining the calibration condition has been met comprises determining that a temperature proximate the synthesizer circuitry has changed by more than a threshold amount.

Example 6 includes the subject matter of example 4, including or omitting optional elements, wherein determining the calibration condition has been met comprises determining that the synthesizer circuitry has been controlled to generate an oscillator signal having the first frequency for a predetermined amount of time.

Example 7 includes the subject matter of examples 1-3, including or omitting optional elements, further including: generating a second control message that will cause a second DS circuitry to generate a second digital DS signal having a second desired frequency based on the oscillator signal having the first frequency, wherein the second desired frequency is proportional to a second desired local oscillator (LO) signal; providing the second control message and the oscillator signal to the second DS circuitry; and converting the second DS signal to an analog signal to generate the second desired LO signal.

Example 8 includes the subject matter of examples 1-3, including or omitting optional elements, wherein the desired frequency is not a factor in the determining of the first frequency.

Example 9 includes the subject matter of examples 1-3, including or omitting optional elements, wherein there is no harmonic relationship between the oscillator signal and the desired LO signal.

Example 10 is local oscillator (LO) signal generation circuitry that includes opportunistic synthesizer circuitry, digital synthesis (DS) circuitry, control circuitry, and a digital to analog converter (DAC). The oopportunistic synthesizer circuitry is configured to generate an oscillator signal based at least on an oscillator control signal. The digital synthesis (DS) circuitry is configured to generate a DS signal having a desired frequency based at least on a control message and a frequency of the oscillator signal, wherein the desired frequency is proportional to a frequency of a desired local oscillator (LO) signal. The control circuitry includes synthesizer control circuitry and DS control circuitry. The synthesizer control circuitry is configured to determine a first frequency to optimize at least one aspect of the opportunistic synthesizer circuitry and control the opportunistic synthesizer circuitry to generate the oscillator signal having the first frequency. The DS control circuitry is configured to generate a control message to cause the DS circuitry to generate a DS signal having the desired frequency based on the oscillator signal having the first frequency and provide the control message and the oscillator signal to the DS circuitry. A digital to analog converter (DAC) is configured to convert the DS to an analog signal to generate the desired LO signal.

Example 11 includes the subject matter of example 10, including or omitting optional elements, wherein the opportunistic synthesizer circuitry includes a narrow band oscillator and a tank circuit, and wherein the synthesizer control circuitry is configured to determine the first frequency that maximizes a Q factor of the tank circuit.

Example 12 includes the subject matter of example 10, including or omitting optional elements, wherein the opportunistic synthesizer circuitry includes an oscillator and a tank circuit, further wherein the synthesizer control circuitry is configured to determine the first frequency by: causing the synthesizer to operate in an open loop mode such that the oscillator oscillates at a free running frequency; measuring a frequency of the signal output by the oscillator; and determining the first frequency to be the measured frequency.

Example 13 includes the subject matter of examples 10-12, including or omitting optional elements, wherein the synthesizer control circuitry is configured to: determine that a calibration condition has been met, determine, for the synthesizer, a second frequency that optimizes the at least one operational aspect of the synthesizer; and control the synthesizer to generate a second oscillator signal having the second frequency. The DS control circuitry is configured to: generate a second control message to cause the DS circuitry to generate the digital DS signal having the desired frequency based on the second oscillator signal having the second frequency; and provide the new control message and the second oscillator signal to the DS circuitry.

Example 14 includes the subject matter of example 13, including or omitting optional elements, wherein the calibration condition comprises a change in a temperature proximate the synthesizer that exceeds a threshold amount.

Example 15 includes the subject matter of example 13, including or omitting optional elements, wherein the calibration condition comprises a time period during which the synthesizer has been controlled to generate an oscillator signal having the first frequency that exceeds a predetermined duration.

Example 16 includes the subject matter of examples 10-12, including or omitting optional elements, further including second DS circuitry and a second DAC. The DS control circuitry is configured to: generate a second control message to cause second DS circuitry to generate a digital DS signal having a second desired frequency based on the oscillator signal having the first frequency, wherein the second desired frequency is proportional to a second desired local oscillator (LO) signal; and provide the second control message and the oscillator signal to the second DS circuitry. The second DAC is configured to convert the second DS signal to an analog signal to generate the second desired LO signal.

Example 17 includes the subject matter of examples 10-12, including or omitting optional elements, wherein the desired frequency is not a factor in the determining of the first frequency.

Example 18 includes the subject matter of examples 10-12, including or omitting optional elements, wherein there is no harmonic relationship between the oscillator signal and the desired LO signal.

Example 19 is control circuitry including synthesizer control circuitry and digital synthesis (DS) control circuitry. The synthesizer control circuitry is configured to control a synthesizer circuity to generate an analog oscillator signal having a first frequency, wherein the first frequency is selected such that when the synthesizer circuitry generates the oscillator signal having the first frequency, phase noise is minimized. The DS control circuitry is configured to generate a control message that will cause DS circuitry to generate a digital DS signal having a desired frequency when the DS circuitry is clocked by the oscillator signal having the first frequency, wherein the desired frequency is selected to be proportional to a frequency of a desired local oscillator (LO) signal and provide the control message and the oscillator signal to the DS circuitry, wherein the digital DS signal generated by the DS circuitry is used to generate the desired LO signal.

Example 20 includes the subject matter of example 19, including or omitting optional elements, wherein the desired frequency is not a factor in the determining of the first frequency.

Example 21 includes the subject matter of example 19, including or omitting optional elements, wherein there is no harmonic relationship between the oscillator signal and the desired LO signal.

Example 22 is an apparatus configured to generate a desired LO signal frequency, including: means for determining, for synthesizer circuitry, a first frequency that optimizes at least one operational aspect of the synthesizer circuitry; means for controlling the synthesizer circuitry to generate an oscillator signal having the first frequency; means for generating a control message for digital synthesis (DS) circuitry that will cause the DS circuitry to generate a digital DS signal having a desired frequency when the DS circuitry is clocked by the oscillator signal having the first frequency, wherein the desired frequency is selected to be proportional to a frequency of the desired local oscillator (LO) signal; means for providing the control message and the oscillator signal to the DS circuitry; and means for converting the DS signal to an analog signal for use in generating the desired LO signal.

Example 23 includes the subject matter of example 22, including or omitting optional elements, wherein the means for determining includes means for causing the synthesizer circuitry to operate in an open loop mode such that the oscillator oscillates at a free running frequency; means for measuring a frequency of the signal output by the oscillator; and means for determining the first frequency to be the measured frequency.

Example 24 includes the subject matter of examples 22-23, including or omitting optional elements, including means for determining that a calibration condition has been met, means for determining, for the synthesizer circuitry, a second frequency that optimizes the at least one operational aspect of the synthesizer circuitry; means for controlling the synthesizer circuitry to generate a second oscillator signal having the second frequency; means for generating a new control message for digital synthesis (DS) circuitry that will cause the DS circuitry to generate the digital DS signal having the desired frequency when the DS circuitry is clocked by the second oscillator signal having the second frequency; means for providing the new control message and the second oscillator signal to the DS circuitry; and means for converting the DS signal to an analog signal for use in generating the desired LO signal.

It is to be understood that aspects described herein may be implemented by hardware, software, firmware, or any combination thereof. When implemented in software, functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer.

Various illustrative logics, logical blocks, modules, and circuits described in connection with aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor may be a microprocessor, but, in the alternative, processor may be any conventional processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration. Additionally, at least one processor may comprise one or more modules operable to perform one or more of the acts and/or actions described herein.

For a software implementation, techniques described herein may be implemented with modules (e.g., procedures, functions, and so on) that perform functions described herein. Software codes may be stored in memory units and executed by processors. Memory unit may be implemented within processor or external to processor, in which case memory unit can be communicatively coupled to processor through various means as is known in the art. Further, at least one processor may include one or more modules operable to perform functions described herein.

Further, the acts and/or actions of a method or algorithm described in connection with aspects disclosed herein may be embodied directly in hardware, in a software module executed by a processor, or a combination thereof. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to processor, such that processor can read information from, and write information to, storage medium. In the alternative, storage medium may be integral to processor. Further, in some aspects, processor and storage medium may reside in an ASIC. Additionally, ASIC may reside in a user terminal. In the alternative, processor and storage medium may reside as discrete components in a user terminal. Additionally, in some aspects, the acts and/or actions of a method or algorithm may reside as one or any combination or set of codes and/or instructions on a machine-readable medium and/or computer readable medium, which may be incorporated into a computer program product.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A method configured to generate an LO signal, comprising:
   causing a narrow band oscillator to operate in an open loop mode;
   measuring a frequency of an oscillator signal output by the narrow band oscillator;
   determining the measured frequency to be a first frequency;
   generating a control message to cause a digital synthesis (DS) circuitry to generate a digital DS signal having a desired frequency based on the oscillator signal having the first frequency, wherein the desired frequency is proportional to a frequency of a desired local oscillator (LO) signal;
   providing the control message and the oscillator signal to the DS circuitry; and
   converting the DS signal to an analog signal to generate the desired LO signal.

2. The method of claim 1, wherein the narrow band oscillator comprises a tank circuit, further wherein the first frequency comprises a frequency that maximizes a Q value for the tank circuit.

3. The method of claim 1, further comprising, after measuring the frequency of the oscillator signal, controlling the narrow band oscillator to generate the oscillator signal having the first frequency.

4. The method of claim 1, further comprising:
   generating a second control message that will cause a second DS circuitry to generate a second digital DS signal having a second desired frequency based on the oscillator signal having the first frequency, wherein the second desired frequency is proportional to a second desired local oscillator (LO) signal;

providing the second control message and the oscillator signal to the second DS circuitry; and converting the second DS signal to an analog signal to generate the second desired LO signal.

5. The method of claim 1, wherein the desired frequency is not a factor in the determining of the first frequency.

6. The method of claim 1, wherein there is no harmonic relationship between the oscillator signal and the desired LO signal.

7. The method of claim 1, comprising:
controlling the narrow band oscillator to generate the oscillator signal having the first frequency;
determining that a calibration condition has been met;
causing the narrow band oscillator to operate in the open loop mode;
measuring a new frequency of the oscillator signal;
determining the new frequency to be a second frequency;
controlling the narrow band oscillator to generate the oscillator signal having the second frequency;
generating a new control message that will cause the DS circuitry to generate the digital DS signal having the desired frequency based on the oscillator signal having the second frequency;
providing the new control message and the oscillator signal to the DS circuitry; and
converting the DS signal to an analog signal to generate the desired LO signal.

8. The method of claim 7, wherein determining the calibration condition has been met comprises determining that a temperature proximate the synthesizer circuitry has changed by more than a threshold amount.

9. The method of claim 7, wherein determining the calibration condition has been met comprises determining that the synthesizer circuitry has been controlled to generate an oscillator signal having the first frequency for a predetermined amount of time.

10. Local oscillator (LO) signal generation circuitry, comprising:
a narrow band oscillator configured to generate an oscillator signal;
synthesizer control circuitry configured to cause the narrow band oscillator to operate in an open loop mode;
frequency estimation circuitry configured to measure a frequency of an oscillator signal output by the narrow band oscillator and determine the measured frequency to be a first frequency;
digital synthesis (DS) circuitry configured to generate a DS signal having a desired frequency based at least on a control message and a frequency of the oscillator signal, wherein the desired frequency is proportional to a frequency of a desired local oscillator (LO) signal;
DS control circuitry, configured to:
generate a control message to cause the DS circuitry to generate a DS signal having the desired frequency based on the oscillator signal having the first frequency; and
provide the control message and the oscillator signal to the DS circuitry; and
a digital to analog converter (DAC) configured to convert the DS signal to an analog signal to generate the desired LO signal.

11. The LO signal generation circuitry of claim 10, wherein the narrow band oscillator comprises a narrow band oscillator and a tank circuit, and wherein the first frequency maximizes a Q factor of the tank circuit.

12. The LO signal generation circuitry of claim 10, further wherein the synthesizer control circuitry is configured to control the narrow band oscillator to generate the oscillator signal having the first frequency.

13. The LO signal generation circuitry of claim 9, further comprising:
second DS circuitry; and
a second DAC; and
wherein the DS control circuitry is configured to:
generate a second control message to cause second DS circuitry to generate a digital DS signal having a second desired frequency based on the oscillator signal having the first frequency, wherein the second desired frequency is proportional to a second desired local oscillator (LO) signal; and
provide the second control message and the oscillator signal to the second DS circuitry; and
wherein the second DAC is configured to convert the second DS signal to an analog signal to generate the second desired LO signal.

14. The LO signal generation circuitry of claim 10, wherein the desired frequency is not a factor in the determining of the first frequency.

15. The LO signal generation circuitry of claim 10, wherein there is no harmonic relationship between the oscillator signal and the desired LO signal.

16. The LO signal generation circuitry of claim 10, wherein:
the synthesizer control circuitry is configured to:
control the narrow band oscillator to generate the oscillator signal having the first frequency;
determine that a calibration condition has been met;
cause the narrow band oscillator to operate in the open loop mode;
measure a new frequency of the oscillator signal;
determine the new frequency to be a second frequency; and
control the narrow band oscillator to generate the oscillator signal having the second frequency; and
the DS control circuitry is configured to:
generate a second control message to cause the DS circuitry to generate the digital DS signal having the desired frequency based on the second oscillator signal having the second frequency;
provide the new control message and the second oscillator signal to the DS circuitry.

17. The LO signal generation circuitry of claim 16, wherein the calibration condition comprises a change in a temperature proximate the synthesizer that exceeds a threshold amount.

18. The LO signal generation circuitry of claim 16, wherein the calibration condition comprises a time period during which the synthesizer has been controlled to generate an oscillator signal having the first frequency that exceeds a predetermined duration.

19. Local oscillator (LO) signal generation circuitry, comprising:
opportunistic synthesizer circuitry configured to generate an oscillator signal based at least on an oscillator control signal;
digital synthesis (DS) circuitry configured to generate a DS signal having a desired frequency based at least on a control message and a frequency of the oscillator signal, wherein the desired frequency is proportional to a frequency of a desired local oscillator (LO) signal;

control circuitry, comprising:
  synthesizer control circuitry configured to:
    determine a first frequency to optimize at least one operational aspect of the opportunistic synthesizer circuitry; and
    control the opportunistic synthesizer circuitry to generate the oscillator signal having the first frequency;
  DS control circuitry, configured to:
    generate a control message to cause the DS circuitry to generate a DS signal having the desired frequency based on the oscillator signal having the first frequency; and
    provide the control message and the oscillator signal to the DS circuitry;
  wherein the synthesizer control circuitry is further configured to:
    determine that a calibration condition has been met,
    determine, for the opportunistic synthesizer circuitry, a second frequency that optimizes the at least one operational aspect of the synthesizer in response to the calibration condition being met; and
    control the synthesizer to generate a second oscillator signal having the second frequency; and
  wherein the DS control circuitry is further configured to:
    generate a second control message to cause the DS circuitry to generate the DS signal having the desired frequency based on the second oscillator signal having the second frequency; and
    provide the second control message and the second oscillator signal to the DS circuitry; and
  a digital to analog converter (DAC) configured to convert the DS signal to an analog signal to generate the desired LO signal.

* * * * *